United States Patent
Kitagawa

(10) Patent No.: US 6,217,704 B1
(45) Date of Patent: Apr. 17, 2001

(54) PLASMA PROCESSING APPARATUS

(75) Inventor: Hideo Kitagawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/399,113

(22) Filed: Sep. 20, 1999

(30) Foreign Application Priority Data

Sep. 22, 1998 (JP) ................................. 10-268784

(51) Int. Cl.[7] .............................. H05H 1/00; C23C 16/00
(52) U.S. Cl. ................................. 156/345; 118/723 MW; 118/715
(58) Field of Search ........................... 156/345; 118/728, 118/715, 723 E, 723 MW, 723 I; 204/298.31

(56) References Cited

U.S. PATENT DOCUMENTS

| | | | |
|---|---|---|---|
| 4,158,589 | * 6/1979 | Keller et al. | 156/345 |
| 5,102,496 | * 4/1992 | Savas | 156/345 |
| 5,942,042 | * 8/1999 | Gogh | 117/728 |
| 5,942,075 | * 8/1999 | Nagahata et al. | 156/345 |

FOREIGN PATENT DOCUMENTS 8-181125    7/1996   (JP) .

* cited by examiner

Primary Examiner—Gregory Mills
Assistant Examiner—P. Hassanzadeh
(74) Attorney, Agent, or Firm—Fitzpatrick, Cella, Harper & Scinto

(57) ABSTRACT

In order to conduct ashing, etching or cleaning of an article to be processed to remove unnecessary matters therefrom and achieve a high processing rate and less charge-up damage by continuously forming negative ions at a high density and making the negative ions incident on the article, a plasma processing apparatus comprises a vacuum vessel, a supporting device for supporting an article to be processed in the vacuum vessel, a device for introducing a first gas into a plasma generating space, a device for feeding electric energy to the first gas in the plasma generating space to generate a plasma, a device for mixing a second gas into the plasma which has been introduced into a negative ion forming space communicating with the plasma generating space, thereby forming negative ions, and a device for drawing out the negative ions therefrom and feeding the negative ions to the article.

11 Claims, 5 Drawing Sheets

PLASMA PROCESSING APPARATUS

BACKGROUND OF THE INVENTION

1. Field of the Invention

This invention relates to a plasma processing apparatus and a processing method making use of the same. More particularly, it relates to a plasma processing apparatus by which negative ions can be generated in a large quantity and also the negative ions can be made incident on an article to be processed to etch or clean the article to remove unwanted matter therefrom, and a processing method making use of the same. This plasma processing apparatus is preferably used in processes for producing semiconductor devices such as LSIs, optical devices such as optical disks and waveguides, and magnetic devices such as magnetic disks.

2. Related Background Art

In general, it is said to be important to lower a plasma temperature in order to form negative ions in a plasma processing apparatus. The relationship between the plasma temperature and the negative ion formation can be known from the probability of attachment of electrons to particles with respect to electronic energy, which is described in, e.g., Basic Data of Plasma Physics (Sanborn C. Brown, AIP press, 1993). It is seen from this publication that the cross section in which the attachment of electrons to, e.g., chlorine-type gas molecules and dissociation thereof has a peak at about 1 eV. Meanwhile, plasma used in usual semiconductor production processes has an electron temperature of 2 to 5 eV. Accordingly, in order to efficiently form negative ions, it is considered necessary to lower the electron temperature to a suitable temperature.

For example, the following two can be given as typical examples of plasma processing apparatuses that utilize negative ions.

(1) Method making use of time afterglow of plasma:

An apparatus disclosed in Japanese Patent Laid-open Application No. 8-181125 can be given as one example of an apparatus utilizing this method. In FIG. 5A, reference numeral 501 denotes a microwave power source; 502, a magnetic-filled coil; 503, a waveguide; 510, an article to be processed; 512, a stand for supporting the article to be processed (hereinafter referred to as "article supporting stand"); 514, a plasma; 531, a vacuum vessel; and 532, a high-frequency power source. In this method, the plasma 514, which is formed by pulse-modulating microwaves generated from the microwave power source 501 at a cycle of 10 to 100 microseconds, is made ON/OFF, and, in the period of plasma-OFF, the plasma temperature is lowered to form negative ions. Also, a high-frequency bias is applied from the high-frequency power source 532 to the supporting stand 512 of the article 510 in synchronization with the pulse modulation of the plasma 514 to alternately draw out positive/negative ions into the article 510 to be processed as shown in FIG. 5B, thus the article 510 is processed.

(2) Method making use of space afterglow to spatially guide plasma downstream:

Not shown in the drawing, this method is a method which comprises placing the article to be processed downstream by tens of centimeters from the region of plasma formation and utilizing negative ions formed while being diffused downstream and cooled gradually.

The above two methods, however, have had the following problems.

i) In the method making use of pulse-modified plasma, positive ions are formed in the remaining half period where plasma is an ON state, and hence a high efficiency is promised for an etching apparatus of positive/negative-ion alternating irradiation. However, in the case of etching carried out by predominantly using negative ions, it is difficult to attain a high efficiency because the negative ions are formed only in the half of the processing time.

ii) In the method where plasma is guided spatially downstream to lower a plasma temperature to form negative ions, the recombination of plasma at vacuum vessel walls causes an abrupt decrease in plasma density itself, and hence the plasma formed in a high density can not efficiently be converted into negative ions.

Thus, in these conventional methods, there has been room for improvement in respect of large-quantity formation of negative ions and effective processing.

SUMMARY OF THE INVENTION

An object of the present invention is to provide a plasma processing apparatus by which negative ions can be continuously formed in a high density and also the negative ions can be made incident on an article to be processed to conduct ashing, etching or cleaning of the article to remove unnecessary matters therefrom, so that a high processing rate and less charge-up damage can be achieved; and to provide a processing method making use of such apparatus.

The plasma processing apparatus according to the present invention comprises:

a vacuum vessel;

supporting means for supporting an article to be processed in the vacuum vessel;

means for introducing a first gas into a plasma generating space;

means for feeding electric energy to the first gas in the plasma generating space to generate a plasma;

means for mixing a second gas into the plasma which has been introduced into a negative ion forming space communicating with the plasma generating space, thereby forming negative ions; and means for drawing out the negative ions and feeding the negative ions to the article.

DESCRIPTION OF THE PREFERRED EMBODIMENTS

The plasma processing apparatus according to the present invention is constituted and operated as described below with reference to the accompanying drawings.

Figure 1:
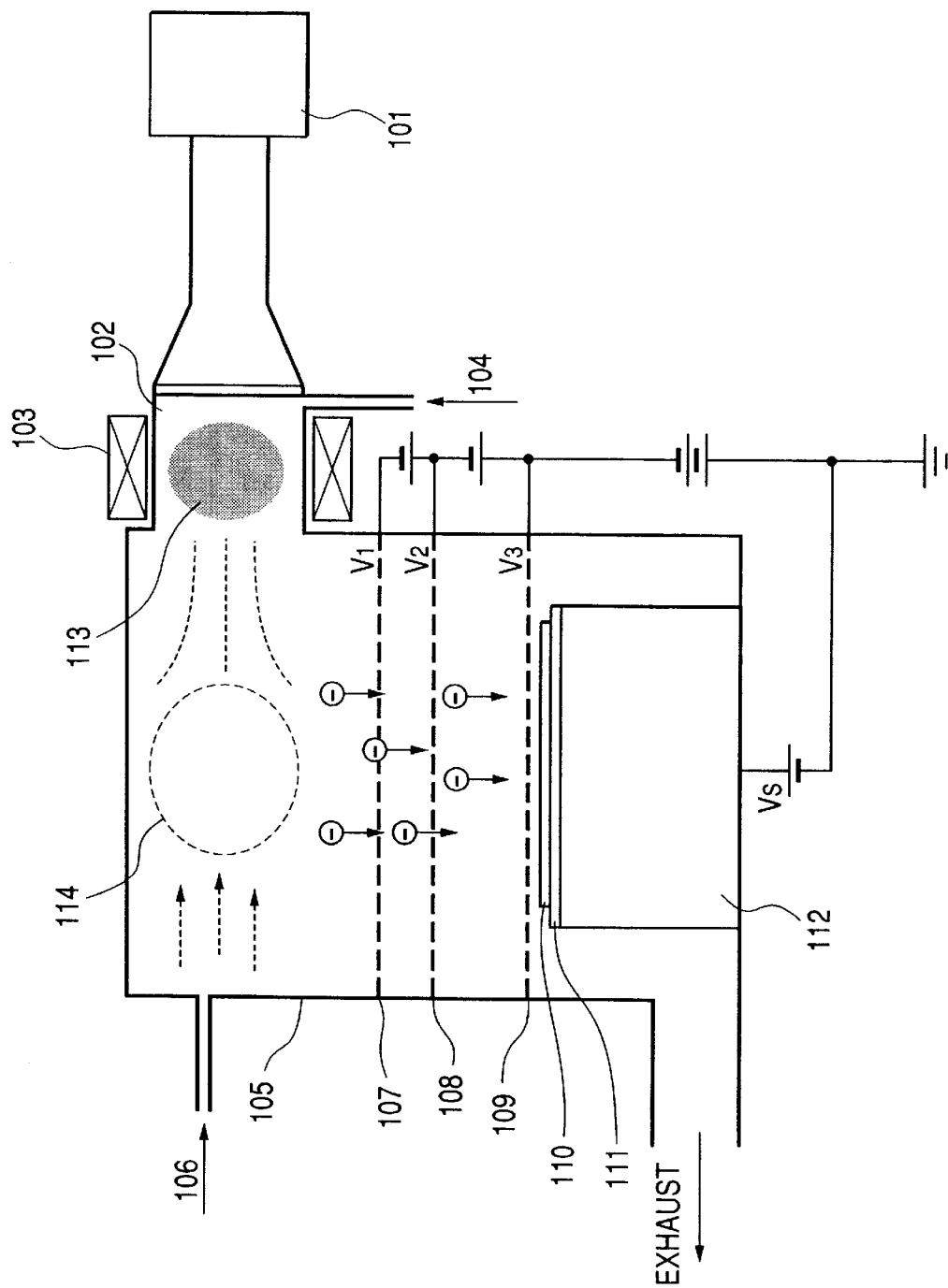
FIG. 1 is a schematic cross-sectional view showing one example of the plasma processing apparatus according to the present invention.

FIG. 1 is a schematic cross-sectional view showing one example of the plasma processing apparatus according to the present invention. In FIG. 1, reference numeral 101 denotes a microwave power source as an electric energy feed source; 102, a plasma generating space; 103, a magnetic-field coil provided optionally; 104, a first-gas inlet; 105, a chamber for processing an article to be processed (hereinafter referred to as "article processing chamber"); 106, a second-gas inlet; 107, a first preliminary grid electrode provided optionally; 108, a second preliminary grid electrode provided optionally; 109, a grid electrode; 110, an article to be processed; 111, an insulating plate provided optionally; 112, an article supporting stand; 113, a plasma; and 114, a negative ion forming space.

In the plasma processing apparatus shown in FIG. 1, the article is processed with plasma in the following procedure.

First, a gas containing a halogen element such as fluorine, chlorine, bromine or iodine and/or a gas containing oxygen are fed into the plasma generating space 102 through the first-gas inlet 104 serving as a first-gas introducing means, and also an electric current is optionally flowed to the magnetic-field coil 103 to apply a magnetic field to the plasma generating space 102. Simultaneously, microwaves as electric energy are fed from the microwave power source 101 to form plasma of the first gas in the plasma generating space 102. Then, the plasma thus formed is diffused into the negative ion forming space 114 of the article processing chamber 105, the space 114 positioned downstream as viewed from the plasma generating space 102. The plasma used here may be generated by any processes of a parallel plate type, an ICP (inductive coupling plasma) type, a magnetron type, an ECR (electron cyclotron resonance) type, a helicone wave type, a surface wave type, a surface wave interference type making use of a planar multiple-slot antenna, and an RLSA (radial line slot antenna) type. Taking account of the fact that the plasma density decreases when the plasma formed is diffused into the negative ion forming space 114 of the article processing chamber 105, positioned downstream as viewed from the plasma generating space 102, preferred is a process in which the plasma density is as high as possible.

Next, as the second gas, at least one gas selected from halogen such as fluorine, chlorine, bromine and iodine gases and inert gases such as helium, neon, argon and xenon gases is fed into the processing chamber 105. The second gas fed here may contain any of molecules, neutral active atoms, ions and electrons so long as it is a gas having a temperature lower than that of the first gas diffused from the plasma generating space 102 into the negative ion forming space 114 in the processing chamber 105.

The negative ions are generated through a process as described below.

The plasma 113 mainly composed of positive ions and electrons is formed in the plasma generating space 102. Then, this plasma 113 is led into the negative ion forming space 114 of the processing chamber 105 and is mixed with a gas having a temperature lower than the temperature of the plasma 113 to abruptly lower the plasma temperature to, e.g., about 1 eV. As the result, the probability of attachment of plasma-constituting electrons to neutral atoms increases, and hence the formation of negative ions that is attributable to the combination of neutral atoms with electrons (electron attachment) or the attachment of electrons to neutral molecules and dissociation thereof (dissociative attachment) takes place in the negative ion forming space 114. As the gas having a temperature lower than the temperature of the plasma, negative gases having a high electronegativity are preferred, and for example, halogen gases such as fluorine, chlorine, bromine and iodine are preferred. In the plasma of such a halogen gas, the combination of neutral atoms or molecules with electrons takes place with ease and the negative ions are formed in a large quantity with ease. Hence, a plasma which contains negative ions in a large quantity comes to be present in the negative ion forming space 114.

In order to predominantly draw out only the negative ions from the thus-formed plasma containing negative ions in a large quantity, the grid electrode 109 is provided in the vacuum vessel, in one case. Then, the first preliminary grid electrode 107 and the second preliminary grid electrode 108 are optionally provided. Also, without providing these grid electrodes, a positive voltage may be applied to the article supporting stand 112, or only the grid electrode 109 may be provided and a positive voltage may be applied thereto. Positive voltages $V_1$ and $V_2$ are further applied to the first and second preliminary grid electrodes, respectively, and the voltages are set so as to be $V_2 > V_1 > V_p > 0$. Here, the $V_p$ is a plasma potential, which usually shows the value of few volts. Since the grid electrodes are disposed in this way, the negative ions are accelerated by an energy expressed as $V_2 - V_p$ (eV), and are drawn out in the direction vertical to the two grids and also in the direction of the article 110. The energy of negative ions can arbitrarily be controlled by adjusting the values of $V_1$ and $V_2$.

In the downstream direction of the negative ions thus drawn out by negative-ion drawing-out electrodes, the article supporting stand 112 is disposed on which the article 110 to be processed has been placed.

In the case shown in FIG. 1, the grid electrode 109 provided just in front of the supporting stand 112 has also the function to capture secondary electrons. Positive voltages $V_s$ and $V_3$ are applied to the supporting stand 112 and grid electrode 109, respectively, and the values of voltage are set so as to be $V_3 > V_s > 0$. Here, the voltage of $V_s$ may be any of a constant DC voltage and a pulsewise DC voltage so long as it is positive voltage.

Thus, the negative ions drawn out from the plasma have the energy of $V_s - V_p$ (eV) and are made incident on the article 110 to be processed. Secondary electrons released from the surface of the article 110 are also accelerated by a potential of $V_3 - V_s$, and are captured by the secondary-electron capturing grid, so that any excess negative electric charges can be prevented from accumulating on the surface of the article 110 to be processed. Hence, in the apparatus according to the present invention, the incident energy of negative ions to be made incident on the article and the quantity of secondary electrons released from the substrate surface can arbitrarily be controlled by controlling the potentials of $V_3$ and $V_s$. Also, if the article 110 to be processed is directly placed on the supporting stand 112, the negative electric charges having accumulated on the surface of the article 110 may flow into the supporting stand 112 through a gate oxide film (not shown) formed on the article 110, consequently bringing about a break of the gate oxide film. In order to greater improve this preventive effect, the insulating plate 111 is provided between the article supporting stand 112 and the article 110 to be processed. As materials for the insulating plate 111, alumina and aluminum nitride are considered as examples, but materials having insulating properties and a high plasma resistance are all usable.

Negative-ion plasma processing of articles to be processed by the use of the apparatus according to the present invention brings about the following advantages.

i) Even when the negative ions are incident on an article to be processed (e.g., a semiconductor substrate having coatings of various types optionally formed thereon), the secondary electrons are released so long as the incident energy is 10 eV or more, and hence the article can be prevented from being negatively charged. Also, even when the incident energy is several ten eV or more and the number of release of secondary electrons with respect to one incident negative ion is two or more, there occurs the action that the electrons are drawn back to the article positively charged, and hence it can be expected to obtain the effect that the charging voltage saturates at few volts to become stable.

ii) There is another advantage that the surface temperature of the article to be processed on which the negative ions have been made incident is lower than that of the case when positive ions are incident thereon. This is due to the fact that the reaction of returning positive ions to neutral atoms is an exothermic reaction of 17 eV and on the other hand the reaction of returning negative ions to neutral atoms is an endothermic reaction of 3 eV. As the result, even when the negative ions are incident on the article to be processed, the article has, in the vicinity of ion incident points, a local surface temperature that is lower than when positive ions are incident. Hence, any thermal damage (e.g., crystal disorder, or change in properties of resist masks) to the article can be kept small.

As described above, the plasma processing apparatus according to the present invention using negative ions can realize good plasma processing which may cause no surface charging of the article to be processed, may cause neither electrostatic breakdown of gate oxide films nor etching malformation due to a bend of the course of ions, and also may cause less thermal damage to the article.

The gas for forming plasma used in the present invention, i.e., the first gas serving as the source of negative ions includes gases containing a halogen element and gases containing oxygen.

Stated specifically, it includes gases composed of halogen elements alone, such as $F_2$, $Cl_2$, $I_2$ and $Br_2$, halogen compound gases such as $CF_4$, $C_2F_6$, $C_3F_8$, $CCl_2F_2$, $CBrF_3$, $CCl_4$, $C_2Cl_2F_4$, $BCl_3$ and $NF_3$, and oxygen-containing gases such as $O_2$ and $O_3$.

As the second gas, the same ones as the first gas or inert gases may be used so long as the temperature of the second gas is lower than that of the plasma of the first gas, though the electron temperature and ion temperature of the second gas formed into plasma have become higher. Preferred are those which can rapidly cool the first gas plasma to about 1 eV.

Voltages applied to the supporting stand and the grid electrode used in the present invention are voltages sufficient for predominantly feeding the negative ions to the article to be processed. Stated specifically, the voltage applied to the supporting stand may preferably be from +50 V to +200 V, and more preferably be from +80 V to +200 V.

The voltage applied to the grid electrode may preferably be from +20 V to +200 V, and more preferably be from +80 V to +200 V.

In the case the grid electrode is provided in plurality as shown in FIG. 1 or in the case a voltage for feeding negative ions is applied to both the supporting stand and the grid electrode, it is desirable to keep the correlation as stated above.

The processing carried out in the present invention is a processing for removing unnecessary matters, such as etching, ashing or cleaning.

Stated specifically, it includes the etching of silicon and silicon compounds such silicon oxide and silicon nitride, the etching of metals (inclusive of alloys) and silicides, the ashing of photoresists, the ashing or cleaning of modified cured films of photoresists, the cleaning of foreign matters on surfaces formed of semiconductors, insulating materials, silicides or metals, and the removing of native oxide films.

Figure 2A:
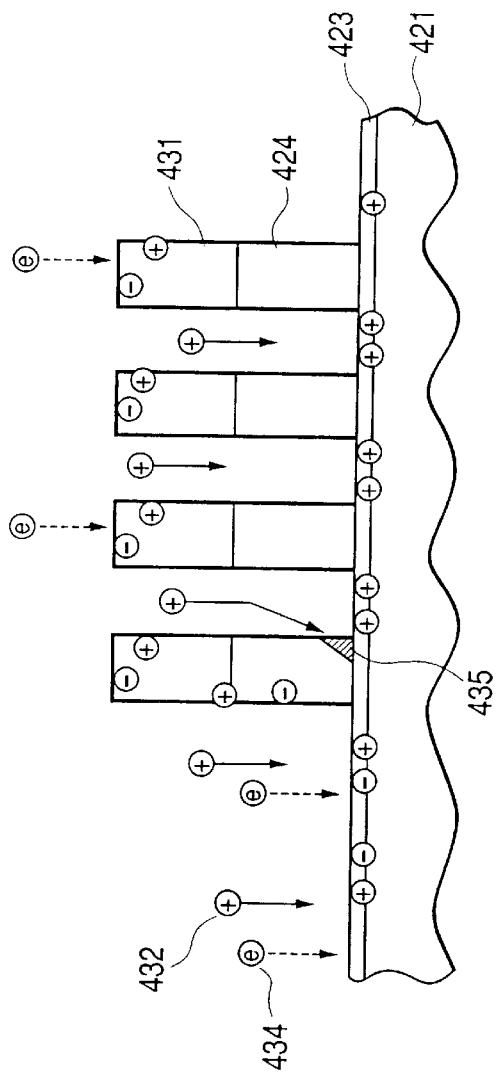
FIGS. 2A and 2B are schematic views explaining the manner of electric charging of semiconductor substrates.
Figure 2B:
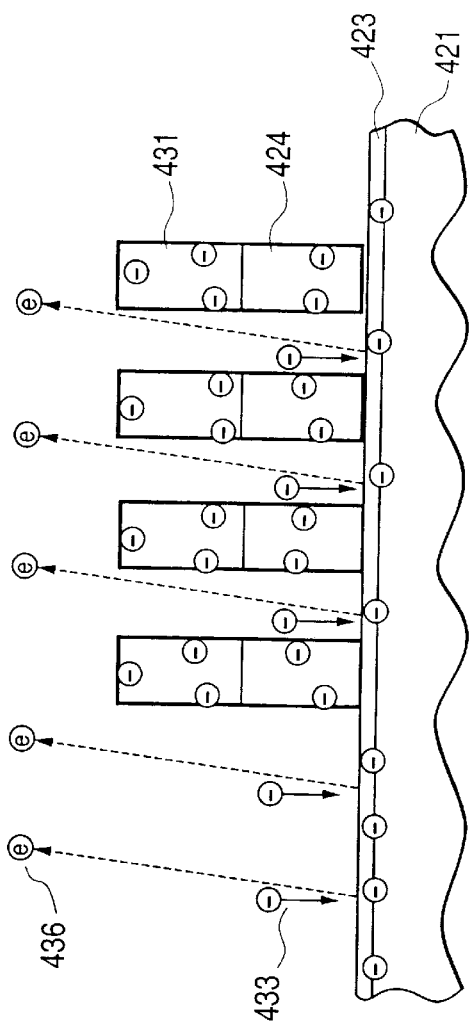

FIGS. 2A and 2B are schematic views showing the cross-sectional structure of a substrate in the step of over-etching in a dry-etching process for forming a gate electrode. In FIGS. 2A and 2B, reference numeral 421 denotes a substrate; 423, an insulating film; 424, an electrode; 431, a photoresist mask; 432, positive ions; 433, negative ions; 434, electrons; 435, a notching; and 436, secondary electrons. Here, the over-etching step refers to etching which is carried out for an excess time because of a problem of wafer in-plane uniformity, in order to remove any slight gate electrode films remaining partially, after the etching for forming the electrode 424 has almost been completed.

FIG. 2A is a schematic cross-sectional view showing an instance of dry etching carried out using positive ions. The positive ions 432 and the electrons 434 are alternately incident on the surface of a semiconductor substrate 421 in the course of one cycle of an AC electric field, whereby the charge quantity on the surface of the substrate 421 is kept constant. However, the electrons 434 have a smaller mass than the positive ions 432 and their course may easily be bent. Hence, as shown in FIG. 2A, the positive ions 432 reach the bottoms of holes having a large width/height ratio (aspect ratio), i.e., deep holes, in a larger quantity than the electrons 434, thereby making the hole bottoms positively charged. As the result, in the outermost wiring of the wirings closely provided together as shown in FIG. 2A, a potential difference may occur between the outermost wiring portion and a region where no wiring is formed, and the course of ions is bent at its electric field, so that an etching malformation called the notching 435 occurs.

Meanwhile, FIG. 2B shows an instance where negative ions are used in the above process. As shown in FIG. 2B, the negative ions 433 have a large mass such that they are uniformly incident on the surface of the substrate 421 without their dependence on the aspect ratio, and the surface of the substrate 421 is slightly negatively charged. The secondary electrons 436 generated upon the incidence of negative ions are captured on a secondary electron capturing grid (not shown) without again attaching to the surface of the substrate 421 having negatively been charged, and hence the surface of the substrate 421 is by no means greatly positively or negatively charged. Thus, under such a condition that the surface of the substrate 421 is uniformly negatively charged as a result of the processing using only negative ions, there is no occurrence that the course of ions is bent by the occurrence of any local electric fields, so that the working of gate electrodes free of malformation can be achieved.

Figure 3:
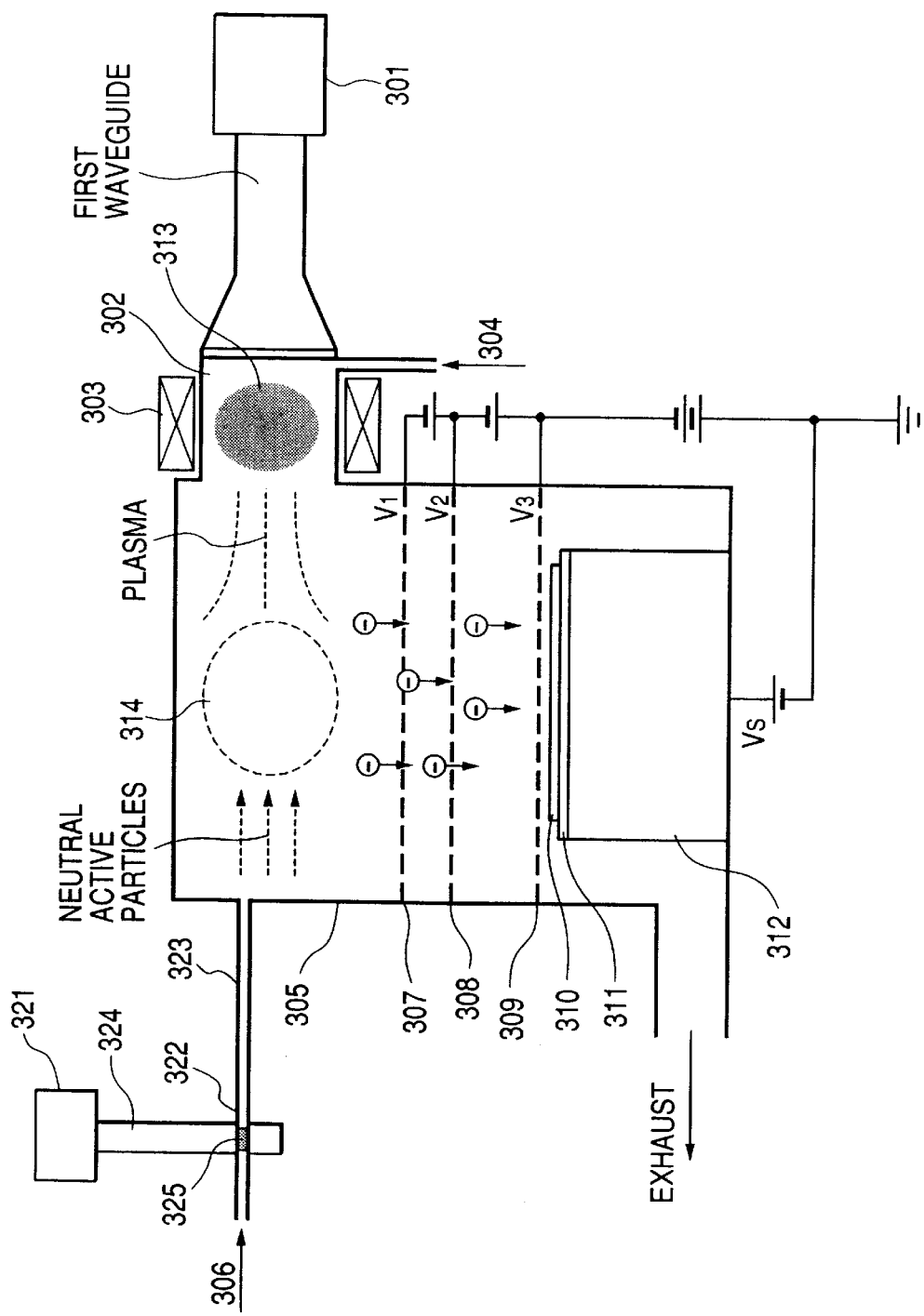
FIG. 3 is a schematic cross-sectional view showing another example of the plasma processing apparatus according to the present invention.

FIG. 3 shows a plasma processing apparatus according to another embodiment of the present invention. Reference numeral 301 denotes a first microwave power source; 302, a plasma generating space; 303, a magnetic-field coil; 304, a first-gas inlet; 305, an article processing chamber; 306, a second-gas inlet; 307, a first preliminary grid electrode; 308, a second preliminary grid electrode; 309, a grid electrode; 310, an article to be processed; 311, an insulating plate; 312, an article supporting stand; 313, a first-gas plasma; 314, a negative ion forming space; 321, a second microwave power source; 322, a discharge tube; 323, a transport tube, 324, a second waveguide; and 325, a second-gas plasma.

The apparatus shown in FIG. 3 is different from the apparatus shown in FIG. 1 in that there is additionally provided, at its part of the second-gas inlet, with the discharge tube 322 for forming a plasma, the second microwave power source 321 and second waveguide 324 through which microwaves are to be fed, and the transport tube 323 through which the ions in the generated plasma are caused to recombine and only neutral active particles are transported to the article processing chamber 305.

The transport tube 323 may have a length and a diameter which are in a size sufficient for the high-energy ions and electrons in plasma to disappear.

The present invention will be described below in more detail by giving Examples. The present invention is by no means limited to these.

EXAMPLE 1

In the present Example, the apparatus shown in FIG. 1 was used, and variations in etching rate when the second gas introduced into the article processing chamber 105 is in ON state (feed state) and in OFF state (feed stopping state) were measured. In this case, an ECR type plasma source was used as the plasma forming means, and a wafer having a silicon oxide film on which a non-doped polycrystalline silicon film was deposited was used as the article 110 to be processed.

First, the article 110 to be processed was placed on the supporting stand 112 of the apparatus shown in FIG. 1. Thereafter, the plasma generating space 102 and the inside of the processing chamber 105 were evacuated via an exhaust means until they came to have a degree of vacuum of $5 \times 10^{-6}$ Torr. Thereafter, 100 sccm of $Cl_2$ gas was fed into the plasma generating space 102 through the first-gas inlet 104, and a throttle valve (not shown) installed to the exhaust means was adjusted to set the pressure to 5 mTorr.

Next, an electric current was flowed to the magnetic-field coil 103 to set the plasma generating space 102 to have a magnetic field of 875 G, and microwaves with a frequency of 2.45 GHz were fed from the microwave power source 101 at an electric power of 1 kW to cause the plasma 113 to take place in the plasma generating space 102. The plasma 113 thus generated was diffused along a diffusion magnetic field of the magnetic-field coil 103 to the side of the article processing chamber 105 communicated with the plasma generating space 102. At this stage, 100 sccm of $Cl_2$ gas was fed into the article processing chamber 105 through the second-gas inlet 104 connected thereto, to cool the diffused plasma to form negative ions in the negative ion forming space 114.

To draw out the negative ions formed in the negative ion forming space 114, DC voltages of +50 V and +75 V were applied to the first preliminary grid electrode 107 and the second preliminary grid electrode 108, respectively. DC voltages of +100 V and +105 V were further applied to the article supporting stand 112 and the grid electrode 109, respectively. Since the plasma potential in the negative ion forming space 114 is estimated to be about 2 to 6 V, it follows that the negative ions are made incident on the article 110 at an energy of about 100 eV when the above voltages are applied to the respective grids.

To confirm the effect in the present Example, the etching rates of the polycrystalline silicon film provided on the surface of the article 110 were compared between the case of the second gas in ON state and the case of the second gas in OFF state. As the result, the etching rate in the case of the gas in OFF state was 70 nm per minute, whereas the etching rate in the case of the gas in ON state was 290 nm per minute. Thus, it was confirmed that the etching rate in the case of the gas in ON state was 4 times or higher in the case of the gas OFF state. From this fact, it is considered that the negative ions were formed in a large quantity and they acted on the article to be processed. Thus, the apparatus of the present Example was found to be an apparatus which can be satisfactory from the viewpoint of mass productivity.

EXAMPLE 2

In the present Example, the apparatus shown in FIG. 1 was used in a cleaning process carried out before a film for upper-layer metal wiring is formed, in a via hole forming process for connecting different wiring layers of multi-layer wiring in semiconductor fabrication processes, and whether or not any charge-up damage occurred was examined.

Native oxide films or crystal defects brought in by ion bombardment at the time of etching remain at the bottoms of via holes formed above the silicon substrate surface. Hence, if second-layer metal wiring is formed in the state the via holes are left as they are, the native oxide films or crystal defects cause increase of the resistance of the via holes to bring about circuit retardation or wiring faulty conduction. Accordingly, these residual matter must be removed by cleaning or the like. At present, methods making use of plasma are widely and commonly used. The problem of these methods is the phenomenon of charge-up caused by plasma. When this cleaning is carried out by a conventional positive ion processing, the positive electric charges introduced by plasma flow to the gate electrode through the first-layer metal wiring, and finally a voltage is applied to the gate oxide film present between the silicon substrate and the gate electrode. As the result, once this voltage reaches a breakdown voltage, the gate oxide film results in electrostatic breakdown. Also, a very weak tunnel electric current may flow through the gate oxide film even at a voltage below breakdown voltage to cause a great deterioration of its lifetime. There have been such drawbacks.

Figure 4:
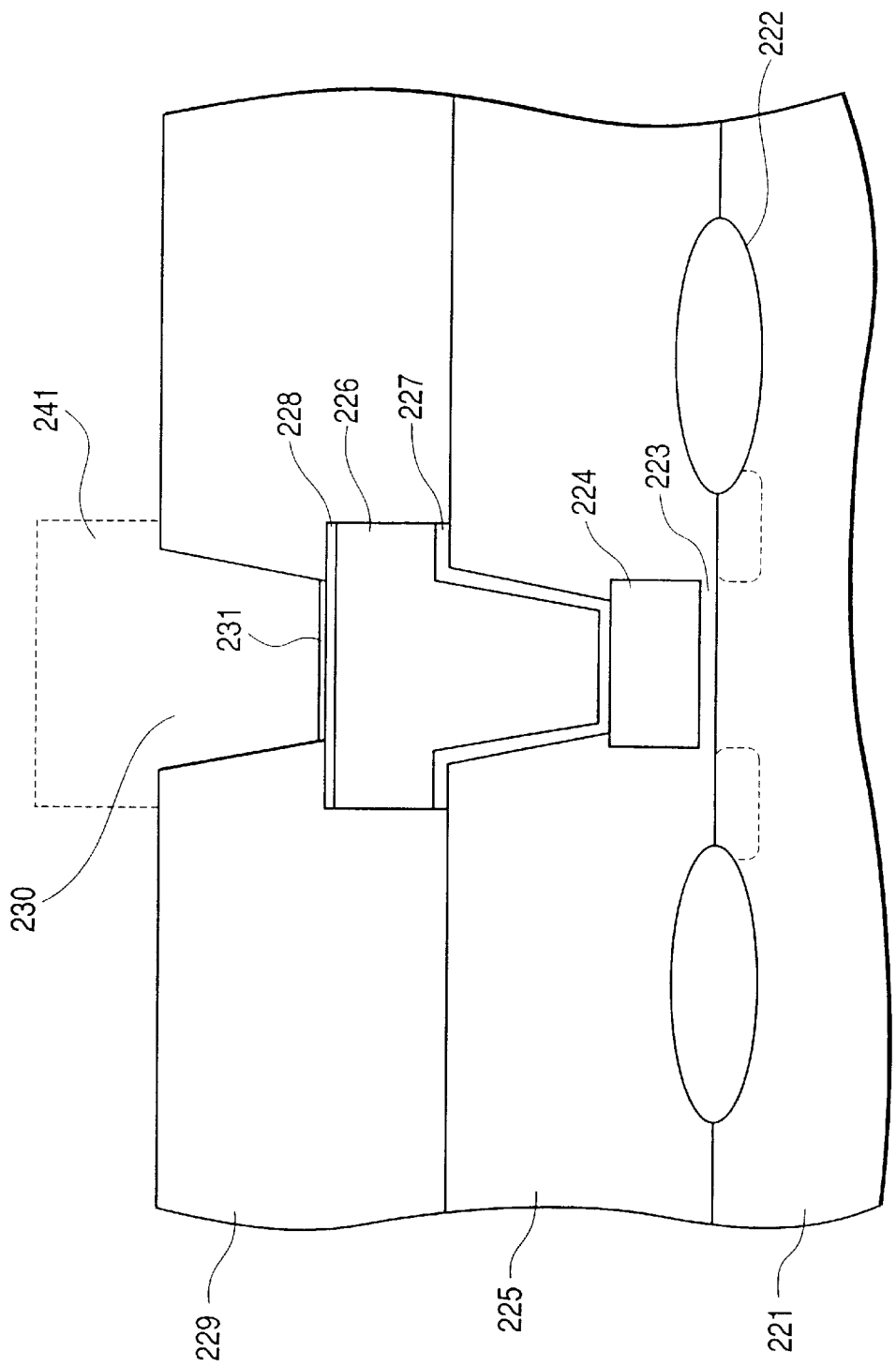
FIG. 4 is a schematic cross-sectional view showing one example of an article to be processed.
Figure 5A:
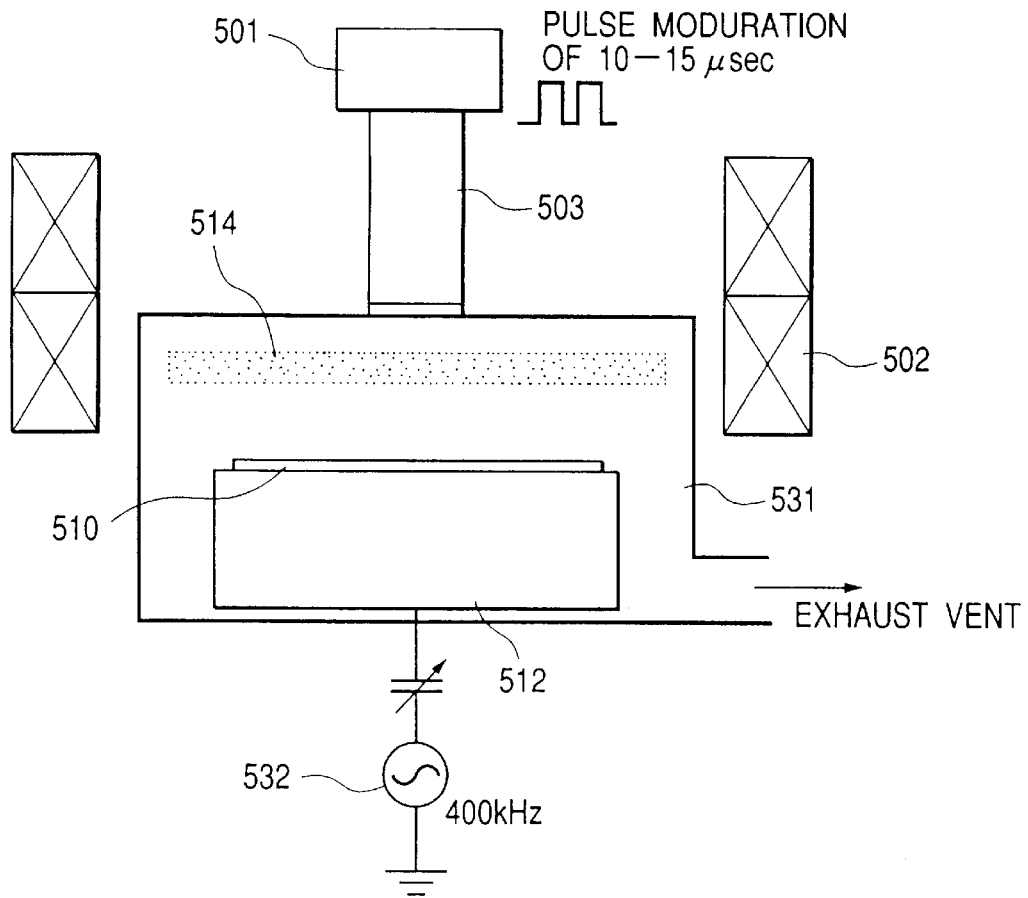
FIG. 5A is a schematic cross-sectional view showing one example of a conventional plasma processing apparatus.
Figure 5B:
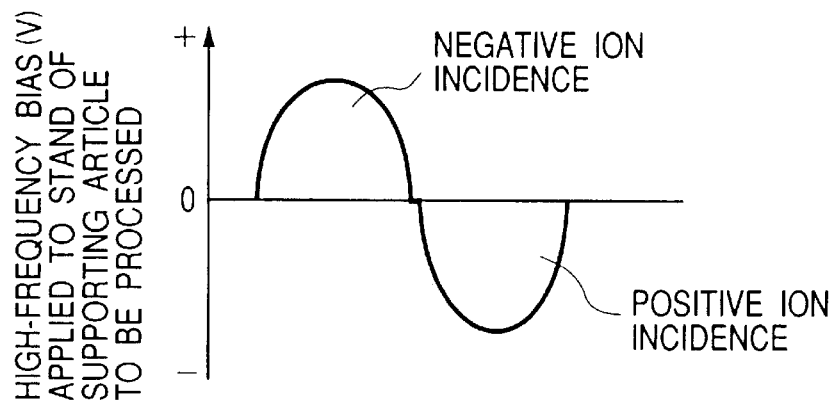
FIG. 5B is a graph showing a relationship between RF voltage and positive/negative ions.

In the present Example, a semiconductor substrate having a cross-sectional structure as shown in FIG. 4 was cleaned by using the apparatus shown in FIG. 1.

In FIG. 4, reference numeral 221 denotes a silicon substrate; 222, an element separating insulating film; 223, a gate oxide film; 224, a gate electrode; 225, a first interlayer oxide film; 226, a first-layer metal wiring; 227, a barrier metal of the first-layer metal wiring; 228, an anti-reflection layer of the first-layer metal wiring; 229, a second interlayer oxide film; 230, a via hole formed by dry etching; 231, a thin oxide layer on the anti-reflection layer surface; and 241, a second-layer metal wiring.

The semiconductor substrate 221 having the above structure was placed on the supporting stand 112 of the apparatus shown in FIG. 1. Thereafter, the plasma generating space 102 and the inside of the processing chamber 105 were evacuated via an exhaust means until they came to have a degree of vacuum of $5 \times 10^{-6}$ Torr. Thereafter, 150 sccm of $SF_6$ gas was fed into the plasma generating space 102, and a throttle valve installed to the exhaust means was adjusted to set the pressure to 10 mTorr.

Next, an electric current was flowed to the magnetic-field coil 103 to form a magnetic field of 875 G in the plasma generating space 102, and microwaves with a frequency of 2.45 GHz were fed from the microwave power source 101 at an electric power of 1 kW to generate the plasma 113 in the plasma generating space 102. The plasma 113 thus generated was diffused along a diffusion magnetic field to the side of the article processing chamber 105 communicated with the plasma generating space 102. At this stage, 150 sccm of $SF_6$ gas was fed into the article processing chamber 105 through the second-gas inlet 106 connected thereto, to cool the diffused plasma to form negative ions in the negative ion forming space 114.

In order to draw out the negative ions formed in the negative ion forming space 114, DC voltages of +50 V and +75 V were applied to the first preliminary grid electrode 107 and the second preliminary grid electrode 108, respectively. DC voltages of +100 V and +105 V were further applied to the semiconductor substrate supporting stand 112 and the grid electrode 109, respectively. Since the plasma potential in the negative ion forming space 114 is estimated to be about 2 to 6 V, it follows that the negative ions are made incident on the semiconductor substrate 110 at an energy of about 100 eV when the above voltages are applied to the respective grids.

By using fluorine negative ions generated by the above process, the article 110 to be processed was subjected to cleaning for 30 seconds, and thereafter the article was moved to a metal wiring film forming chamber (not shown) while keeping the article 110 in vacuum. The deposition for the second-layer metal wiring 241 was conducted on the article and further the steps of patterning and dry etching were conducted by using a photoresist, to form the second-layer metal wiring 241. Characteristics of the semiconductor device thus completed were evaluated in the following way.

Characteristics of the semiconductor device were evaluated by using 100 transistors for evaluation which were fabricated on 8-inch silicon wafer and by measuring the quantity of electric charges brought in until the gate oxide film of each transistor resulted in breakdown, $Q_{bd}$. As the result, the following was confirmed. In the conventional cleaning process making use of positive ions, devices showing a failure that the $Q_{bd}$ was below 10 coulombs were two samples in the 100 samples. On the other hand, in the case of the present invention making use of negative ions, there was no device at all which caused the deterioration of gate oxide film performance.

EXAMPLE 3

In the present Example, an instance is described where the apparatus shown in FIG. 3 was used and the second gas for cooling the plasma was fed in the form of neutral active particles.

By using the above apparatus, the etching rate of the polycrystalline silicon film was measured in the same manner as in Example 1. In this case, the wafer having a silicon oxide film on which a non-doped polycrystalline silicon film was deposited was used as the article 310 to be processed.

First, the article 310 to be processed was placed on the supporting stand 312 of the apparatus shown in FIG. 3. Thereafter, the plasma generating space 302 and the inside of the processing chamber 305 were evacuated via an exhaust means until they came to have a degree of vacuum of $5 \times 10^{-6}$ Torr. Thereafter, 100 sccm of $Cl_2$ gas was fed into the plasma generating space 302 through the first-gas inlet 304, and a throttle valve (not shown) installed to the exhaust means was adjusted to set the pressure to 5 mTorr.

Next, an electric current was flowed to the magnetic-field coil 303 to form a magnetic field of 875 G in the plasma generating space 302, and microwaves with a frequency of 2.45 GHz were fed from the first microwave power source 301 at an electric power of 1 kW to generate the first plasma 313 in the plasma generating space 302. The plasma 313 thus generated was diffused along a diffusion magnetic field to the side of the processing chamber 305 communicated with the plasma generating space 302.

Meanwhile, 100 sccm of $Cl_2$ gas was fed into the discharge tube 322 through the second-gas inlet 306, and microwaves of 250 W were further fed from the second microwave power source 321 to generate the second plasma 322 in the discharge tube 322. Among constituents of the second plasma 322 thus generated, ions rapidly recombined as a result of their collision against the wall and between particles to disappear, and only neutral active particles with a relatively long lifetime passed through the transport tube 323 and reached the processing chamber 305 to cool the first plasma 313 diffused from the plasma generating space 302 to the processing chamber 305 side, whereby negative ions were formed in the negative ion forming space 314.

In order to draw out the negative ions formed in the negative ion forming space 314, DC voltages of +50 V and +75 V were applied to the first preliminary grid electrode 307 and the second preliminary grid electrode 308, respectively. DC voltages of +100 V and +105 V were further applied to the supporting stand 312 and the grid electrode 309, respectively. Since the plasma potential in the negative ion forming space 314 is estimated to be about 2 to 6 V, it follows that the negative ions are made incident on the article 310 at an energy of about 100 eV when the above voltages are applied to the respective grids.

The etching rate of the polycrystalline silicon film of the wafer processed in the above procedure was measured to find that the etching rate was about 350 nm per minute. Namely, it has become apparent that a much higher etching rate can be achieved by using the apparatus shown in FIG. 3 than the case shown in Example 1 where gas molecules were mixed (the etching rate was about 290 nm per minute).

As described above, the present invention can provide a plasma processing apparatus by which negative ions can be formed in a large quantity and also the negative ions can be made incident on the article to be processed to etch or clean the article. In doing so, since in the present apparatus the negative ions can be predominantly used in a large quantity, plasma processing with less charge-up damage can be realized. Also, in the present apparatus, when the plasma is mixed with a gas having a lower temperature than the plasma, negative ions can be formed in a large quantity and the etching rate utilizing negative ions can also greatly be improved.

What is claimed is:

1. A plasma processing apparatus comprising:
   a vacuum vessel;
   supporting means for supporting an article in the vacuum vessel;
   means for introducing a first gas containing at least one of halogen and oxygen into a plasma generating space;
   means for feeding electric energy to the first gas in the plasma generating space to generate a plasma;
   means for mixing a second gas having a temperature lower than that of the plasma into the plasma which has been introduced into a negative ion forming space which is distinct from and in communication with the plasma generating space, thereby forming negative ions; and
   means for drawing out the negative ions from the negative ion forming space and feeding the negative ions to the article.

2. The plasma processing apparatus according to claim 1, wherein the means for generating a plasma is one selected from a parallel electrodes type, an inductive coupling plasma type, a magnetron type, an electron cyclotron resonance type, a helicone wave type, a surface wave type, a planar multiple-slot antenna using surface wave interference type, and a radial line slot antenna type electric energy feed sources.

3. The plasma processing apparatus according to claim 1, wherein the first gas comprises at least one element selected from the group consisting of chlorine, flourine, bromine, iodine and oxygen.

4. The plasma processing apparatus according to claim 1, wherein the second gas comprises at least one kind selected from the group consisting of a gas comprising a halogen element and an inert gas.

5. The plasma processing apparatus according to claim 1, wherein the second gas contains at least one kind of neutral active particles, electrons and ions.

6. The plasma processing apparatus according to claim 1, wherein the means for drawing out and feeding the negative ions to the article is at least one of a grid electrode to which a positive voltage is to be applied and the article supporting means to which a positive voltage is to be applied.

7. The plasma processing apparatus according to claim 6 wherein a potential $V_p$ of the plasma generated in the negative ion forming space and a positive voltage $V_g$ applied to the grid electrode have a relationship of $V_g > V_p > 0$.

8. The plasma processing apparatus according to claim 1, further comprising a means for applying a positive direct-current voltage or a pulsewise voltage to the article.

9. The plasma processing apparatus according to claim 8, further comprising a means for electrically insulating the article from the supporting means.

10. The plasma processing apparatus according to claim 1, further comprising a means for capturing secondary electrons emitted from the article.

11. The plasma processing apparatus according to claim 10, wherein a positive voltage $V_s$ to be applied to the supporting means and a positive voltage $V_g$ to be applied to the grid electrode have a relationship of $V_g > V_s > 0$.

* * * * *

UNITED STATES PATENT AND TRADEMARK OFFICE
CERTIFICATE OF CORRECTION

PATENT NO. : 6,217,704 B1
DATED : April 17, 2001
INVENTOR(S) : Hideo Kitagawa

Page 1 of 1

It is certified that error appears in the above-identified patent and that said Letters Patent is hereby corrected as shown below:

<u>Title page,</u>
Item [56] References Cited, insert:
-- OTHER PUBLICATIONS
Sanborn C. Brown, Basic Data on Plasma Physics 178 (AIP Press 1993), page 178. --.

<u>Column 2,</u>
Line 11, "can not" should read -- cannot --.

<u>Column 8,</u>
Line 21, "matter" should read -- matters --.

Signed and Sealed this

Fourteenth Day of May, 2002

Attest:

Attesting Officer

JAMES E. ROGAN
*Director of the United States Patent and Trademark Office*